(12) United States Patent
Buchert et al.

(10) Patent No.: US 7,830,670 B2
(45) Date of Patent: Nov. 9, 2010

(54) SLIDING CARD CARRIER

(75) Inventors: George Buchert, San Diego, CA (US); Julia M. Elbert, San Diego, CA (US)

(73) Assignee: Mission Technology Group, Inc., San Diego, CA (US)

( * ) Notice: Subject to any disclaimer, the term of this patent is extended or adjusted under 35 U.S.C. 154(b) by 736 days.

(21) Appl. No.: 11/760,546

(22) Filed: Jun. 8, 2007

(65) Prior Publication Data

US 2008/0307141 A1 Dec. 11, 2008

(51) Int. Cl.
*H05K 7/14* (2006.01)
(52) U.S. Cl. ............... 361/796; 361/756; 361/802; 361/797; 710/301
(58) Field of Classification Search .......... 361/826, 361/796, 797, 788, 756, 741, 802; 710/300, 710/301
See application file for complete search history.

(56) References Cited

U.S. PATENT DOCUMENTS

| | | | |
|---|---|---|---|
| 3,140,907 A | 7/1964 | Davies | |
| 3,173,732 A | 3/1965 | James | |
| 3,215,968 A | 11/1965 | Herrmann | |
| 3,518,612 A | 6/1970 | Dunman et al. | |
| 3,731,252 A | 5/1973 | McKeown et al. | |
| 3,829,817 A | 8/1974 | Beavitt | |
| 3,858,154 A | 12/1974 | William | |
| 3,858,961 A | 1/1975 | Goodman et al. | |
| 3,993,383 A | 11/1976 | Marino | |
| 4,057,311 A | 11/1977 | Evans | |
| 4,402,562 A | 9/1983 | Sado | |
| 4,521,065 A | 6/1985 | Nestor et al. | |
| 4,715,820 A | 12/1987 | Andrews, Jr. et al. | |
| 4,998,886 A | 3/1991 | Werner | |
| 5,587,877 A * | 12/1996 | Ryan et al. | ............... 361/679.6 |
| 5,761,030 A * | 6/1998 | Roscoe | ............... 361/679.58 |
| 5,825,615 A * | 10/1998 | Ohara | ............... 361/679.6 |
| 6,025,989 A * | 2/2000 | Ayd et al. | ............... 361/695 |
| 6,462,670 B1 * | 10/2002 | Bolognia et al. | ............... 340/815.45 |
| 6,496,364 B1 * | 12/2002 | Medin et al. | ............... 361/679.4 |
| 6,549,400 B1 * | 4/2003 | Medin et al. | ............... 361/679.41 |
| 6,580,616 B2 | 6/2003 | Greenside et al. | |
| 6,590,151 B1 * | 7/2003 | Merk et al. | ............... 174/365 |
| 6,600,656 B1 * | 7/2003 | Mori et al. | ............... 361/724 |
| 6,611,424 B2 * | 8/2003 | Huang | ............... 361/679.39 |
| 6,711,012 B1 * | 3/2004 | Medin et al. | ............... 361/679.45 |
| 6,826,055 B2 * | 11/2004 | Mease et al. | ............... 361/725 |
| 7,327,580 B2 * | 2/2008 | Ruque | ............... 361/760 |

FOREIGN PATENT DOCUMENTS

WO 9933377 A1 7/1999

* cited by examiner

*Primary Examiner*—Dameon E Levi
(74) *Attorney, Agent, or Firm*—Nydegger & Associates

(57) ABSTRACT

A system and method is provided for individually changing the peripheral cards of an electronic device, when the cards are operationally held inside a chassis on a rack cabinet. Included is a platform for holding the peripheral cards, and a slide carrier mounted on the chassis for moving the platform with cards into and out of the internal chamber of the chassis. Importantly, this is done while the chassis remains stationary on the rack cabinet. When moved outside the chassis chamber, each peripheral card can be individually handled (i.e. installed or removed) without contact or operational interference with other peripheral cards held on the platform. Adapters on the platform can be adjusted to accommodate the dimensions of each peripheral card.

14 Claims, 1 Drawing Sheet

SLIDING CARD CARRIER

FIELD OF THE INVENTION

The present invention pertains generally to systems and methods for connecting an electronic device, such as a computer, with a peripheral card. More particularly, the present invention pertains to systems and methods that provide operational access to peripheral cards. The present invention is particularly, but not exclusively, useful as a system and method for removing, installing or replacing a single peripheral card in a chassis, when a plurality of peripheral cards are installed in one of a plurality of chassis that is mounted in a rack cabinet.

BACKGROUND OF THE INVENTION

In a computer system, there are various components that need to be electrically interconnected with each other in order for the system to accomplish its intended functional purpose. The main component of such a system is a central processor, or central processing unit (CPU). Internally, the CPU includes an arithmetic logic unit and a control unit. A CPU, however, will typically require electrical connections to external, application-specific devices that provide wherewithal for the CPU to accomplish particular functions. These devices are commonly referred to as "peripherals" or "peripheral cards" and, in general, they will each constitute an individual unit, such as an input device, an output device or a backing store.

As technology has progressed, and computer applications have become more convoluted, computer systems have become larger and much more complex. For one, more components are required. In commercial ventures, it now happens that even relatively unsophisticated computer systems can require many different peripherals. And, in each case, these peripherals need to somehow be properly integrated into a system. Further, the peripherals are preferably connected and supported in a manner that allows them to be easily accessed for replacement and maintenance purposes. Normally, such support is provided by a chassis.

In general, a chassis is an outer structural framework that is used to support electronic device(s). More specifically, in the context of the present invention, a chassis is typically shaped as a rectangular prism, and the devices it supports are peripheral cards. In most instances, several different peripheral cards (e.g. as many as four) are mounted on the same chassis. Further, large computer systems can require many chassis, with each chassis housing several peripherals. For each system, the actual number of chassis can vary significantly according to system requirements. On the other hand, the size of an individual chassis will depend primarily on the size and number of the peripheral cards it needs to hold.

Industry wide, variations in the size of chassis have been somewhat standardized. In general, all computer system chassis have a standard width. The height (or depth) of a chassis, however, can vary according to standardized units generally classified as "U's", wherein one "U" is equal to one and three-quarters of an inch (1U=1.75 in.). Thus, depending on its depth (height), a chassis may be a one, two, three or four "U" chassis. In any event, it is not surprising that as the number of required peripherals increases for a particular computer system, so does the number of chassis. A consequence of this is: it is now common practice to stack many chassis on a same rack cabinet.

For many reasons, it can happen from time to time that a single peripheral card needs to be installed, removed, or replaced. When the peripheral card of interest is located in a chassis that is one of a large number of chassis on a rack cabinet, access to the particular peripheral card can be problematic. Heretofore, in such cases, it was necessary to remove the entire chassis from the rack cabinet. Then, once removed, it was necessary to remove the top panel from the chassis for access to the peripheral cards inside the chassis. All of this required special tooling, many man-hours and, more importantly, it often required the system be taken off-line while the changes in peripherals were being made.

In light of the above, it is an object of the present invention to provide a system and method that facilitates removing, installing or replacing a peripheral card of a computer system, when the card is operationally mounted on a chassis and the chassis is mounted on a rack cabinet. Another object of the present invention is to provide a system and method for removing, installing or replacing a peripheral card of a computer system that provides an adjustable mechanism for mounting different sized peripheral cards on the same chassis. Still another object of the present invention is to provide a system and method that allows for the installation, removal or replacement of a peripheral card without otherwise interfering with or obstructing the operation of the computer system in which the peripheral card is a component. Yet another object of the present invention is to provide a system and method for removing, installing or replacing a peripheral card of a computer system that is relatively easy to manufacture, is simple to operate and is comparatively cost effective.

SUMMARY OF THE INVENTION

In accordance with the present invention, a system and method for installing, removing or replacing a peripheral card in a computer system envisions a platform for holding the peripheral card. Further, the platform is mounted in a chassis, and the chassis is held on a rack cabinet with many other similar chassis. In this environment, the system and method of the present invention facilitate access either directly to the peripheral card or to the location where it is to be mounted in the particular chassis. Importantly, this access can be accomplished without disengaging or removing the chassis from the rack cabinet.

For purposes of the present invention, a peripheral card is considered to be substantially flat and rectangular in shape. Thus, it has a front edge, a rear edge and a pair of opposed side edges. The electronic components that provide functional capabilities for the peripheral card are then mounted directly on the card.

Structurally, the system of the present invention includes a chassis that is substantially shaped like a rectangular prism. Accordingly, the chassis has a top panel, a bottom panel, opposed side members and opposed ends that together define a hollow, internal chamber for the chassis. A carrier on a slide rail is mounted on the bottom panel of the chassis, and the above-mentioned platform is mounted on the carrier. Further, a plurality of adapters is mounted on the platform. In this combination, the platform and its adapters can slide on the chassis for movement in the chamber on a path between the top and bottom panels and through an end of the chassis.

Each adapter on the platform is specifically configured to receive and hold a peripheral card. To do this, a mechanical connector is mounted on a side edge of the peripheral card for direct engagement with the platform. Specifically, this engagement is made at a fixed, predetermined point on the platform. For the other side edge of the peripheral card, the adapter includes a card guide. Unlike the fixed mechanical connector, however, the card guide is affixed to an adjuster that can be selectively positioned on the platform at a distance from the fixed point where the mechanical connector engages with the platform. With this adjuster, the card guide can be positioned on the platform to accommodate the length of the front edge of the peripheral card. Additionally, an electronic connector is mounted on the platform for electrical engagement with the front edge of the peripheral card. Further, thumbscrews mounted on the platform are provided to engage/disengage the platform with the chassis.

In the operation of the present invention, the platform and its associated peripheral cards are moveable between a first position and a second position. Specifically, in the first position, the peripheral card(s) are located inside the chassis chamber. In the second position, the peripheral card(s) are located outside the chassis chamber. For this movement, the thumbscrews on the platform are first manipulated to disengage the platform from the chassis. The platform and its peripheral cards are then moved from the first position to the second position. Once in the second position, the thumbscrew on the side edge of the adapter is manipulated to disengage the peripheral card from the platform. At this point, the peripheral card can slide along the card guide to release its front end from the electrical connector. The peripheral card can then either be repaired or replaced. While the platform is in its second position, peripheral card(s) can be inserted or installed on the platform, as desired. Thereafter, the platform and its associated peripheral cards can be returned to the first position.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENTS

Figure 1:
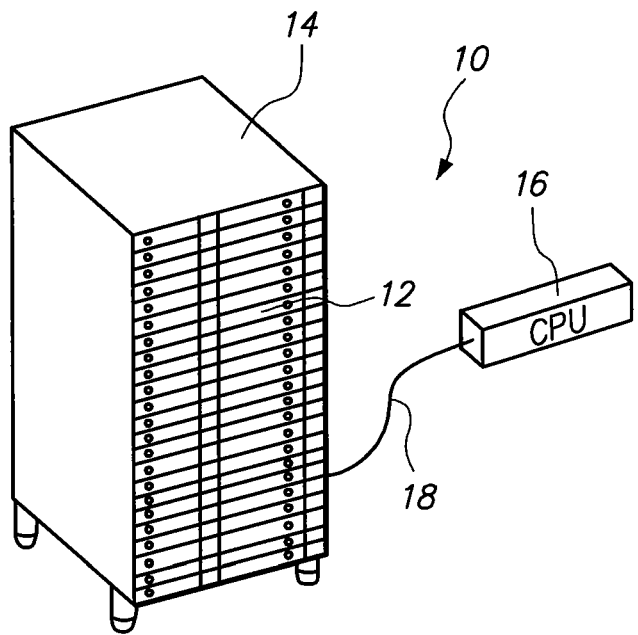
FIG. 1 is a perspective view of a plurality of chassis mounted on a rack cabinet for use with a CPU in a computer system.

Referring initially to FIG. 1, a system in accordance with the present invention is shown and is generally designated 10. In FIG. 1 it will be seen that the system 10 can include a plurality of chassis 12 that are collectively mounted on a same rack cabinet 14. For purposes of this disclosure, however, a single chassis 12 (shown in FIG. 2) is considered. Nevertheless, it will be appreciated by skilled artisans that, in accordance with the present invention, other chassis 12 will be substantially similar. With this in mind, FIG. 1 also shows that the system 10 includes a computer processing unit (CPU) 16 that is electronically connected to the rack cabinet 14 via a wire or cable 18.

Figure 2:
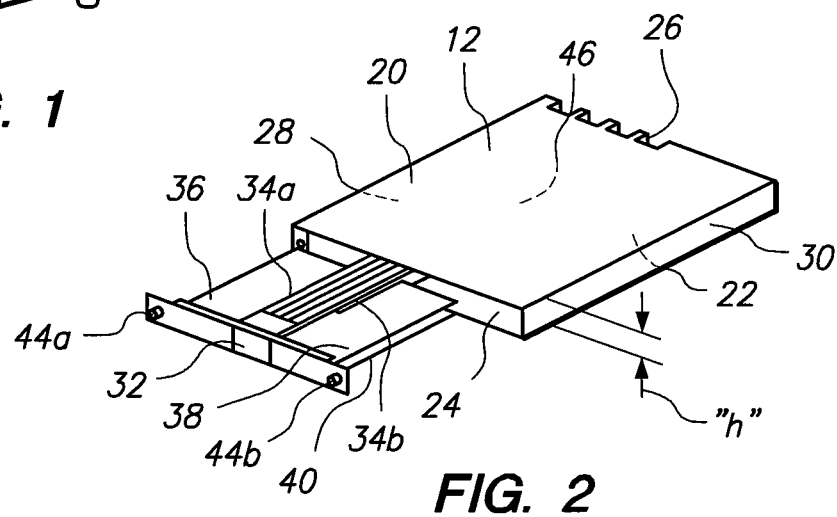
FIG. 2 is a perspective view of a chassis with a platform and associated peripheral cards extending outside the chamber of the chassis.
Figure 3:
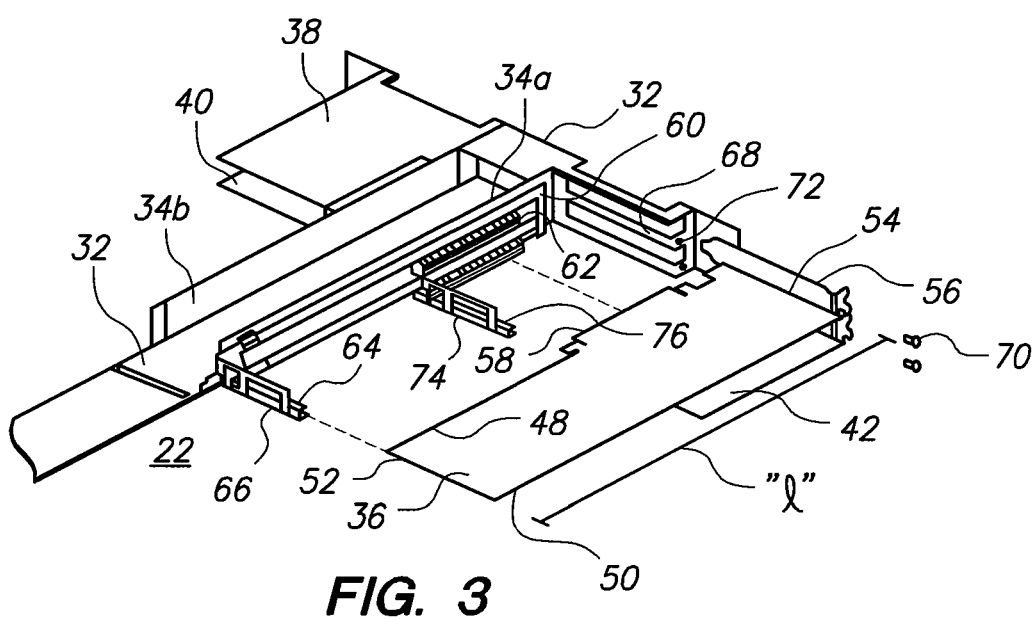
FIG. 3 is an exploded perspective view of a platform and associated peripheral cards.

In FIG. 2, a single chassis 12 is shown to be a rectangular, prism shaped structure having a top panel 20, a bottom panel 22, a pair of opposed ends 24 and 26, and a pair of opposed side members 28 and 30. The height "h" of the chassis 12 (i.e. the distance between top panel 20 and bottom panel 22) is typically measured in units (i.e. U's) that are one and three quarter inches each. The height "h" for the chassis 12 is considered here to be 1U. FIG. 2 also shows the system 10 includes a carrier 32 that is mounted on the chassis 12. And, it includes a pair of platforms 34a and 34b that are respectively mounted on the carrier 32. Additionally, FIG. 2 shows a peripheral card 36 mounted on the platform 34a, and peripheral cards 38 and 40 mounted on the platform 34b. With reference to FIG. 3, it will be seen that an additional peripheral card 42 can be mounted on the platform 34a, along with the peripheral card 36. As intended for the present invention, this arrangement allows as many as four different peripheral cards 36, 38 40 and 42 to be mounted on a same chassis 12. Importantly, in the arrangement shown, each peripheral card 36, 38, 40 and 42 is equally accessible.

Still referring to FIG. 2, the carrier 32 and platforms 34a and 34b are shown in a position wherein they are located outside an internal chamber 46 that is formed inside the chassis 12 between the top and bottom panels 20, 22. As indicated above, when in the position shown in FIG. 2, all of the peripheral cards 36, 38, 40 and 42 are exposed so they can be equally and easily manipulated or accessed for installation, removal or replacement. It is an important aspect of the present invention that this access is possible, even though the chassis 12 remains mounted on the rack cabinet 14. Further, it is to be appreciated that when the removal, replacement or installation of a peripheral card 36, 38, 40 or 42 has been completed, the carrier 32, along with platforms 34a and 34b, and their respective peripheral cards 36, 38, 40 and 42 can be repositioned inside the chamber 46 of the chassis 12. Thumbscrews 44a and 44b can then be engaged with the end 24 of chassis 12 to hold the carrier 32 and the peripheral cards 36, 38, 40 and 42 inside the chamber 46.

In greater detail, the structural aspects of the present invention will be best appreciated with reference to FIG. 3. For clarity, the disclosure here focuses on only the interaction of the peripheral card 36 with the platform 34a. It must be appreciated, however, that the interaction of the other peripheral cards 38, 40 and 42 with their respective platforms 34a or 34b are essentially the same. With this understanding, FIG. 3 shows that the exemplary peripheral card 36 is substantially flat and has a front edge 48, a rear edge 50 and a pair of opposed side edges 52 and 54. Further, it is seen that the peripheral card 36 has a mechanical connector 56 that is affixed to its side edge 54. Though not shown, various electrical components can be mounted on the peripheral card 36 for the purpose of performing specific functions with the CPU 16. Electrically, these components are connected in contact with leads (also not shown) that are positioned along the portion 58 of front edge 48.

Still referring to FIG. 3, it is seen that an adapter 60 is mounted directly on the platform 34a. More specifically, the adapter 60 includes an electrical connector 62, and it includes a card guide 64 that is attached to an adjuster 66. Also, the adapter 60 includes an extension 68. Importantly, the adjuster 66 can be selectively positioned on the adapter 60 in order to accommodate the length "l" of the front edge 48 of the peripheral card 36. For an engagement of the peripheral card 36 with the platform 34a, these components must interact with each other.

To engage the peripheral card 36 with the platform 34a, the adjuster 66 is first positioned on the adapter 60. Specifically, this is done with consideration given to the length "l" of the front edge 48 of the peripheral card 36. The mechanical connector 56 can then be engaged with the extension 68 of the adapter 60. As the mechanical connector 56 is being engaged with the extension 68, the side edge 52 of peripheral card 36 is able to slide into the card guide 64. Also, during this engagement, the portion 58 on front edge 48 of the peripheral card 36 makes electrical contact with the electrical connector 62. With this electrical contact, and with the side edge 52 of peripheral card 36 held in the card guide 64, the thumbscrew 70 is engaged with the fixed point 72 to firmly hold the peripheral card 36 on the platform 34a.

In the operation of the system 10 of the present invention, whenever access to a peripheral card (e.g. peripheral card 36) is required, or whenever a new peripheral card 36 needs to be installed in the system 10, the chassis 12 that is holding the peripheral card 36 is identified on the rack cabinet 14. The thumbscrews 44a and 44b on the chassis 12 are then loosened, and the carrier 32 is pulled from the chamber 46 of chassis 12, and into the position shown in FIG. 2. In this position, all of the peripheral cards 36, 38, 40 and 42 that are mounted in the chassis 12 on platforms 34a and 34b, as well as the carrier 32, are exposed and accessible. Next, a thumbscrew 70 (see FIG. 3) on the mechanical connector 56 is loosened. This disconnects the peripheral card 36 from the platform 34a, and it (the peripheral card 36) can then be removed and repaired or replaced, as necessary.

The installation of a peripheral card 36 on a chassis 12 essentially includes the steps set forth above for the removal of a peripheral card 36. Specifically, the carrier 32 needs to be pulled from the chamber 46 of the chassis 12. Then, once the adjuster 66 and its card guide 64 are properly positioned on the adapter 60 (i.e. to accommodate the length "l" of the front edge 48 of peripheral card 36), the side edge 52 of the peripheral card 36 can be positioned in the card guide 64. The peripheral card 36 is then moved forward toward the platform 34a and the mechanical connector 56 is engaged with the adapter 60. This is done by tightening the thumbscrew 70 into a receptacle at the point 72 on adapter 60. This also causes the portion 58 of front edge 48 of peripheral card 36 to electrically engage with the electrical connector 62. Note: the distance between card guide 64 and the point 72, where the mechanical connector 56 engages with the adaptor 60, is established by the length "l" of the peripheral card 36. By way of comparison, an adjuster 74 and its associated card guide 76 are shown positioned in FIG. 3 to accommodate the peripheral card 42. The difference in the sizes of the peripheral cards 36 and 42 is accounted for by the comparative positions of the adjusters 66 and 74 on the adapter 60. When the peripheral card 36 has been engaged with the platform 34a, the carrier 32 can be returned to its position in the chamber 46 of chassis 12, and secured there by tightening the screws 44a and 44b. As will be appreciated by the skilled artisan, one or more peripheral cards 36, 38, 40 or 42 can be individually or collectively removed, replaced or installed on a chassis 12 without interrupting the operation of any other peripheral card 36, 38, 40 or 42 in any chassis 12 in a rack cabinet 14. Stated differently, power to the rack cabinet 14 or to individual chassis 12 in the rack cabinet 14 can continue while individual peripheral cards 36, 38, 40 or 42 are being manipulated.

While the particular Sliding Card Carrier as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A system for selectively removing and installing a peripheral card on a rack cabinet, for the use of peripheral cards with an electronic device, the system comprising:

a chassis mounted on the rack cabinet, with the chassis defining an internal chamber;

a platform slidingly mounted on the chassis for movement between a first position, wherein the platform is located inside the chamber of the chassis and a second position, wherein the platform is located outside the chamber of the chassis;

a plurality of adapters mounted on the platform, with each adapter configured to securely hold a peripheral card on the platform for movement therewith, wherein each peripheral card is substantially flat, is substantially rectangular in shape, and is bounded by a front edge having a length, and a rear edge with a pair of opposed side edges therebetween, and with each adapter presented to establish an electrical connection between the peripheral card and the electronic device;

a card guide mounted on the platform for receiving a first side edge of the peripheral card;

an adjuster mounted on the card guide for selective engagement of the card guide with the adapter to accommodate the length of the front edge of the peripheral card;

an electronic connector mounted on the platform for engagement with the front edge of the peripheral card to establish an electrical connection with the peripheral card; and a mechanical connector affixed to the second side edge of the peripheral card for fixed engagement with the platform to securely hold the peripheral card on the adapter.

2. A system as recited in claim 1 wherein the mechanical connector is a screw.

3. A system as recited in claim 1 wherein the adjuster is selectively affixed to the adapter to position the card guide for receiving a peripheral card having a length for its front edge in a range between 3 and 20 inches.

4. A system as recited in claim 3 wherein the chassis defines a plane, with the sliding movement of the platform being along a linear path in the plane, and wherein each peripheral card is mounted on the platform substantially parallel to the plane and to other peripheral cards mounted on the platform.

5. A system as recited in claim 1 further comprising:

a carrier for supporting the platform; and a slide rail assembly mounted on the chassis and attached to the carrier to provide for the sliding movement of the carrier and the platform on the chassis.

6. A system as recited in claim 5 further comprising screws mounted on the carrier for selective engagement with the chassis to hold the platform in the first position.

7. A system as recited in claim 1 wherein a plurality of chassis is mounted on the rack cabinet.

8. A system for removing and installing a peripheral card on a chassis, wherein the chassis is a rectangular prism having a top panel and a bottom panel with opposed side members and opposed ends defining a chamber for the chassis, the system comprising:

a platform slidingly mounted on the bottom panel of the chassis for movement through an end thereof between a first position, wherein the platform is located inside the chamber of the chassis, and a second position, wherein the platform is located outside the chamber; and a plurality of adapters mounted on the platform, with each adapter configured to securely hold a peripheral card on the platform for movement therewith, and presented to establish an electrical connection between the peripheral card and an electronic device, wherein each peripheral card is substantially flat and is substantially rectangular in shape, and wherein the card is bounded by a front edge having a length, and a rear edge with a pair of opposed side edges therebetween;

a card guide mounted on the platform for receiving a first side edge of a peripheral card;

an adjuster mounted on the card guide to selectively engage the card guide with the adapter to accommodate the length of the front edge of the peripheral card;

an electronic connector mounted on the platform for engagement with the front edge of the peripheral card to establish an electrical connection with the peripheral card; and a mechanical connector affixed to the second side edge of the peripheral card for fixed engagement with the chassis to securely hold the peripheral card on the adapter.

9. A system as recited in claim 8 wherein the chassis defines a plane, with the sliding movement of the platform being along a linear path in the plane, and wherein each peripheral card is mounted on the platform substantially parallel to the plane and to other peripheral cards mounted on the platform.

10. A system as recited in claim 8 further comprising:
a carrier for supporting the platform;
a slide rail assembly mounted on the bottom of the chassis and attached to the carrier to provide for the sliding movement of the carrier and the platform on the chassis; and
a plurality of screws mounted on the carrier for selective engagement with the chassis to hold the platform in the first position.

11. A system as recited in claim 8 wherein a plurality of chassis are mounted on a rack cabinet.

12. A method for using a system to selectively remove and install a peripheral card in a chassis mounted on a rack cabinet, wherein the peripheral card is substantially flat, is substantially rectangular in shape, and is bounded by a front edge and a rear edge with a pair of opposed side edges therebetween, wherein the chassis defines an internal chamber, with a platform slidingly mounted on the chassis for movement between a first position wherein the platform is located inside the chamber and a second position wherein the platform is located outside the chamber, and wherein a plurality of adapters are mounted on the platform, wherein each adapter is configured to securely hold a peripheral card on the platform for movement therewith, wherein each adapter includes a card guide mounted on the platform for receiving a first side edge of a peripheral card, an adjuster mounted on the card guide for selective engagement with the adapter to position the card guide, an electronic connector mounted on the platform for engagement with the front edge of the peripheral card to establish an electrical connection with the peripheral card, and a mechanical connector affixed to the second side edge of the peripheral card for fixed engagement with the chassis to securely hold the peripheral card on the adapter, and each adapter is presented to establish an electrical connection between the peripheral card and an electronic device, the method comprising the steps of:

releasing the platform from the chassis for movement relative thereto;

moving the platform out of the chassis chamber and to its second position;

disconnecting a peripheral card from the platform while the platform is in its second position to remove the peripheral card from the chassis and rack cabinet;

installing a peripheral card on the platform while the platform is in its second position;

returning the platform with peripheral card from its second position to its first position inside the chassis chamber; and engaging the platform with the chassis to hold the platform thereon.

13. A method as recited in claim 12 further comprising the step of selectively affixing the adjuster to the adapter to position the card guide to accommodate a length of the front edge of the peripheral card.

14. A method as recited in claim 12 wherein the releasing step, the disconnecting step, the installing step and the engaging step are accomplished solely by manipulating a screw.

\* \* \* \* \*